United States Patent [19]

Bouhenguel et al.

[11] Patent Number: 5,742,513
[45] Date of Patent: Apr. 21, 1998

[54] METHODS AND SYSTEMS FOR AUTOMATIC TESTING OF A RELAY

[75] Inventors: Redjem Bouhenguel, North Lauderdale; James P. Garitty, Coral Springs, both of Fla.

[73] Assignee: ABB Power T&D Company Inc., Raleigh, N.C.

[21] Appl. No.: 647,638

[22] Filed: May 15, 1996

[51] Int. Cl.⁶ .................. H02H 3/00; H02H 7/26
[52] U.S. Cl. ............ 364/492; 364/483; 324/418; 324/424
[58] Field of Search ............... 324/418, 424; 364/184, 492, 483; 361/64, 68, 63, 79, 66, 78, 80–81, 83, 115, 85, 113, 76, 91; 371/20.1; 340/870.02; 307/127; 327/333

[56] References Cited

U.S. PATENT DOCUMENTS

| | | | |
|---|---|---|---|
| 3,560,798 | 2/1971 | Tenebaum | 317/22 |
| 4,001,654 | 1/1977 | Davis et al. | 361/172 |
| 4,025,767 | 5/1977 | Bottard | 395/183.01 |
| 4,398,232 | 8/1983 | Elmore | 361/47 |
| 4,420,788 | 12/1983 | Wilkinson et al. | 361/85 |
| 4,420,805 | 12/1983 | Yamaura et al. | 364/184 |
| 4,511,981 | 4/1985 | Andow et al. | 364/492 |
| 4,517,619 | 5/1985 | Uekubo | 361/64 |
| 4,541,058 | 9/1985 | Andow et al. | 364/483 |
| 4,556,841 | 12/1985 | Carlson | 324/73.1 |
| 4,561,120 | 12/1985 | Andow et al. | 359/177 |
| 4,604,674 | 8/1986 | Hamel | 361/73 |
| 4,689,570 | 8/1987 | Ohgaki et al. | 324/418 |
| 4,709,295 | 11/1987 | Yamaura et al. | 361/80 |
| 4,737,879 | 4/1988 | Anderson et al. | 361/80 |
| 4,751,604 | 6/1988 | Wilkinson | 361/68 |
| 4,841,405 | 6/1989 | Udren | 361/80 |
| 4,968,960 | 11/1990 | Bouhenguel et al. | 335/101 |
| 4,994,934 | 2/1991 | Bouhenguel | 361/71 |
| 5,103,298 | 4/1992 | Kashimura et al. | 348/572 |
| 5,160,926 | 11/1992 | Schweitzer, III | 340/870.02 |
| 5,477,408 | 12/1995 | Schweitzer, III et al. | 361/63 |
| 5,576,625 | 11/1996 | Sukegawa et al. | 324/424 |
| 5,659,549 | 8/1997 | Oh et al. | 371/21.3 |

*Primary Examiner*—Emanuel T. Voeltz
*Assistant Examiner*—Cuong H. Nguyen
*Attorney, Agent, or Firm*—Woodcock Washburn Kurtz Mackiewicz & Norris LLP

[57] ABSTRACT

A system and method for automatically testing the operation of a protective relay system is disclosed. The system and method provide for continuous testing to ensure proper operation of the protective relay system while the relay remains in service and without interrupting the normal operation of the relay. This testing is performed by storing reference data corresponding to test signals, generating test signals, sampling a specific test signal, processing that test signal through the relay and comparing the processed test signal with the corresponding reference data. Upon detection of an error in the relay, the system and method further provide for isolation of the relay from the electric power system and automatic testing of individual electrical components within the protective relay system to determine the identity of the malfunctioning component. The method of determining the malfunctioning component requires: selecting a component for testing, generating a test signal, providing the test signal as an input to the selected component, processing the test signal through the selected component and the subsequent component in the protective relay system and comparing the processed test signal with corresponding reference data. Finally, the system and method further provide for automatic correction of the malfunctioning component, if possible.

44 Claims, 11 Drawing Sheets

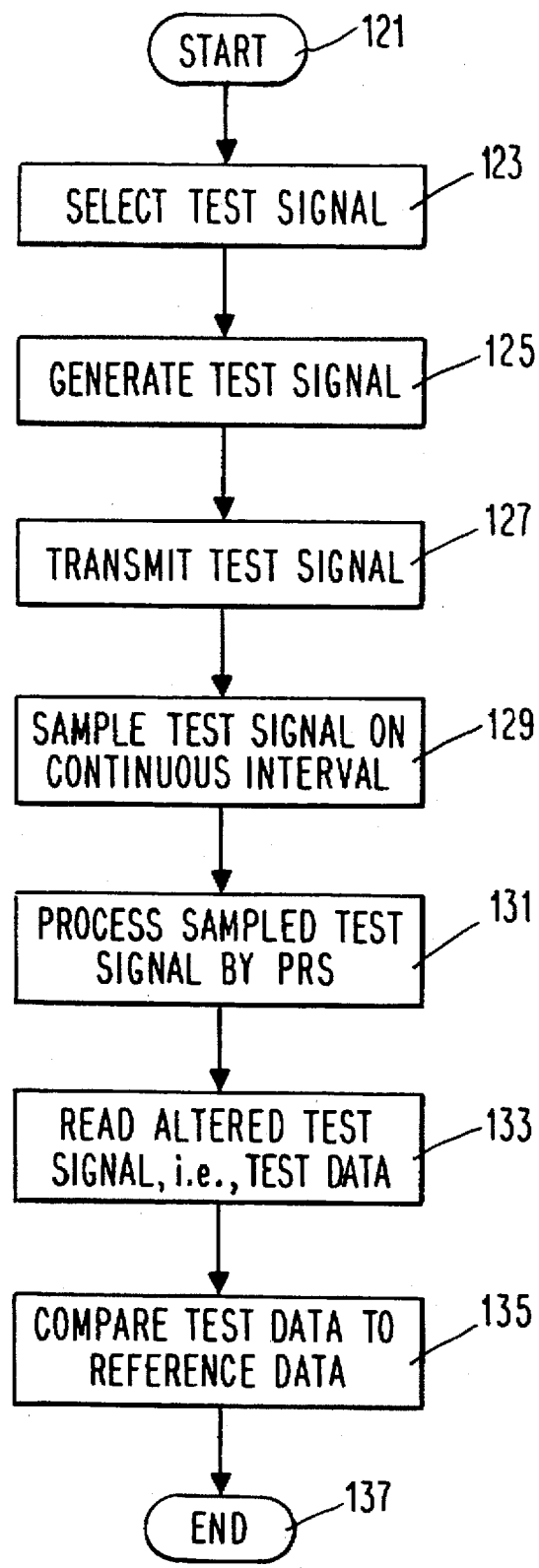
Fig. 8 (STEP 83)

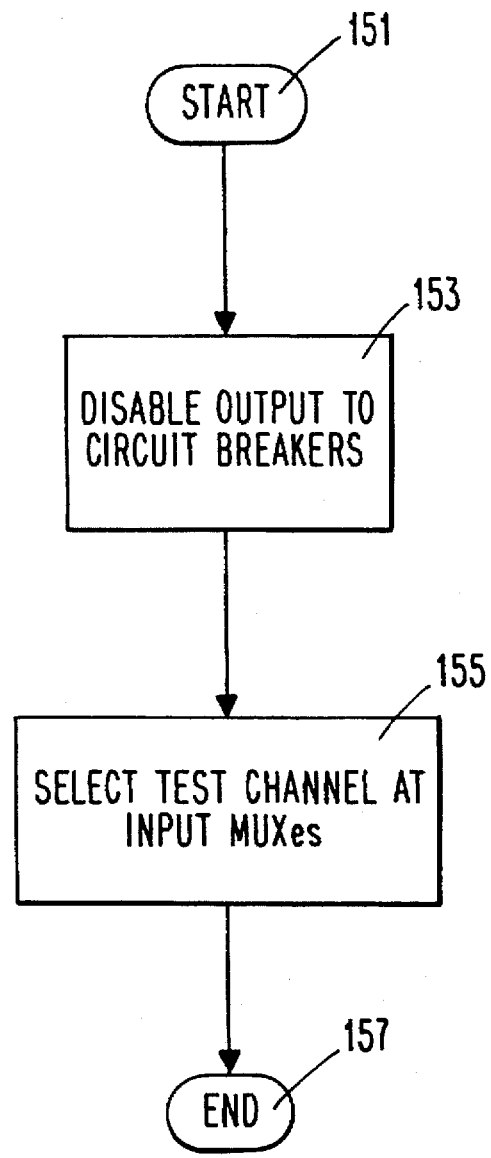
*Fig. 9* (STEP 87)

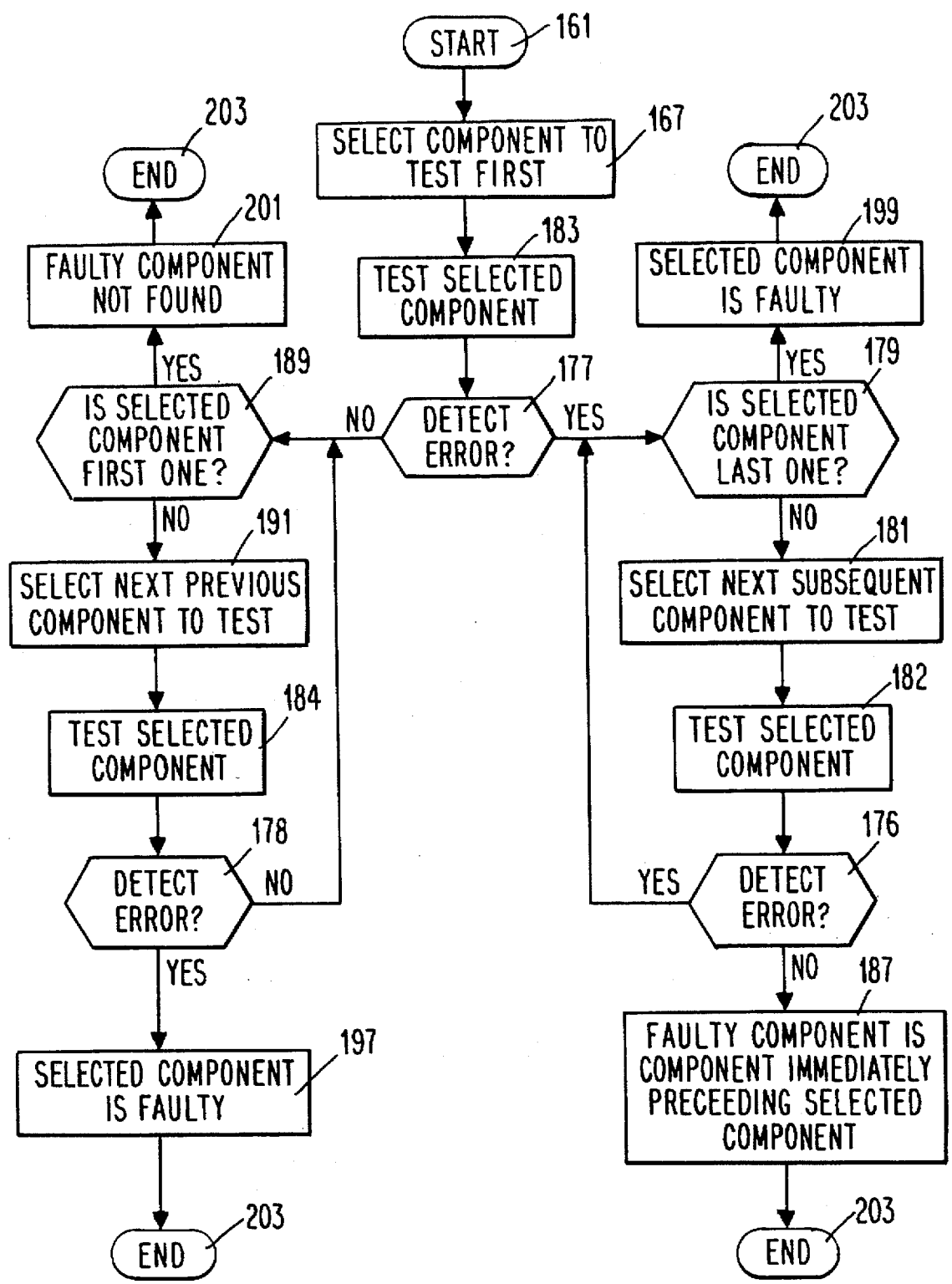
Fig. 10 (STEP 89)

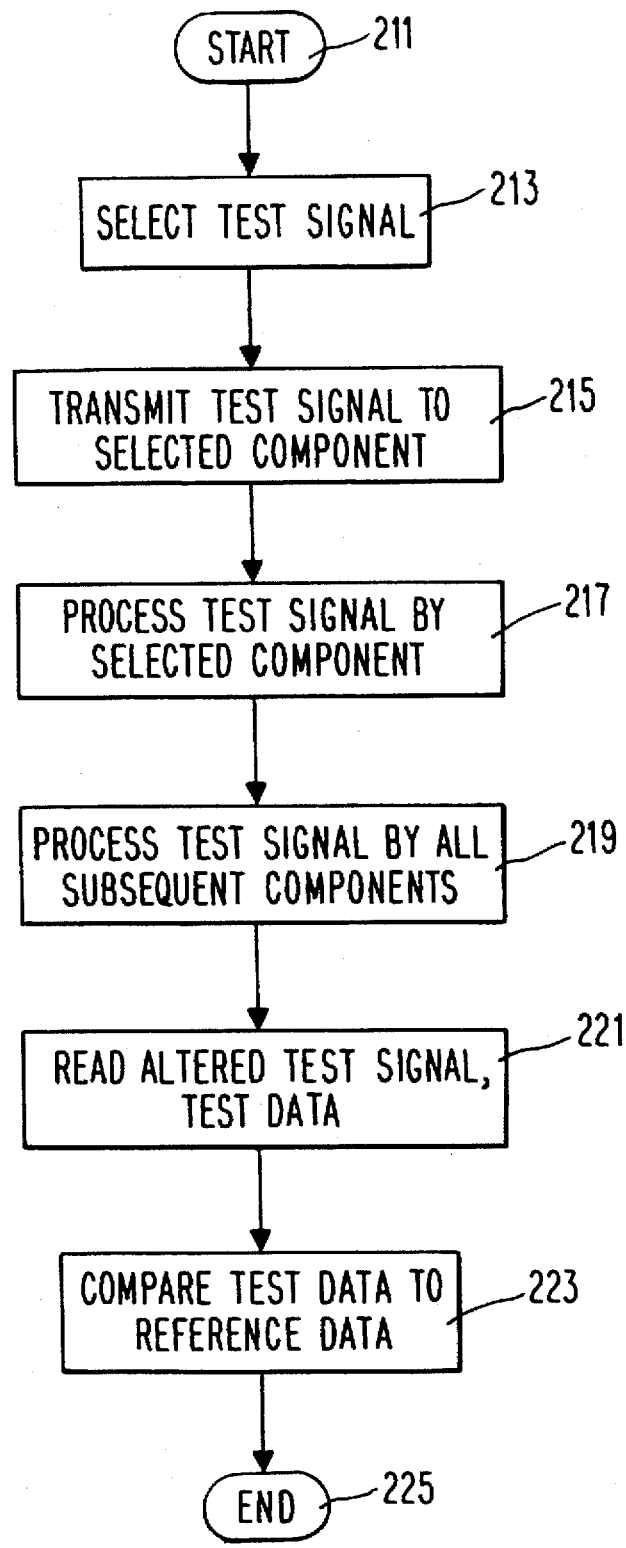
Fig. 11 (STEPS 182, 183 & 184)

METHODS AND SYSTEMS FOR AUTOMATIC TESTING OF A RELAY

FIELD OF THE INVENTION

The present invention generally relates to protective relays used for fault detection and protection in connection with electric power transmission and distribution systems. More specifically, the invention relates to systems and methods for automatically testing microcomputer-based protective relays.

BACKGROUND OF THE INVENTION

Microcomputer based protective relays are commonly used in electric power systems to detect faults on power lines. Relays prevent those faults from propagating through the electric power system by activating circuit breakers to isolate the faults. FIG. 1 is a block diagram showing a typical arrangement in which a protective relay system 1 is interfaced to a power system via power transmission lines 3. As shown in FIG. 1, the protective relay system accepts inputs 29 from the respective power lines 3, here shown as a three phase transmission line, which have been reduced by current transformers 7 and voltage transformers 9 to practical levels for use by the protective relay system. The protective relay system processes the inputs from the power line to detect faults occurring on and propagating down the power lines. If a fault is detected, the protective relay system transmits an output signal 25 to circuit breakers 5 which are interfaced to the power lines. The circuit breakers 5 act as switches to prevent the fault detected by the protective relay system from continuing its flow on the power line and causing more damage to electrical components and connections further down on the power line.

FIG. 2 is a block diagram of the protective relay system shown in FIG. 1. As shown in FIG. 2, the protective relay system 1 includes a succession of serially connected components 11, 13, 15, 17. One component of the protective relay system is a first processor 11, typically a microprocessor such as a MC 68360. The first processor is connected to a local memory 41 for storing instructions and information. A selector, such as a multiplexor 17, receives low level equivalents of the signals on the power line 3 derived from the voltage transformers 9 and current transformers 7 as the inputs 29. The multiplexor repeatedly selects an input to be processed by the relay at predetermined intervals, as explained in more detail below, in conjunction with FIG. 3.

Once the multiplexor has selected an input signal, the signal is transmitted as an input to the next component in succession, the analog to digital (A/D) converter 15. The A/D converter 15 converts this analog input signal, received from the power line 3, to a digital signal representative of the magnitude of the analog signal received. The output from the A/D converter provides the input to a second processor 13, such as a digital signal processor (DSP). The DSP 13, processes the input signal in accordance with a predefined procedure to collect information relating to the power system, such as for detecting faults or disturbances on the power line.

The DSP performs the same operation on a multitude of input signals within a predetermined time, the DSP algorithm period 65, which is explained in more detail in connection with FIG. 3. After a specified number of inputs have been processed by the DSP, typically about twenty, the results from the operation of the DSP are sent at a predetermined time 69 to the first processor 11. The first processor analyzes the results from the DSP and sends an output signal 25 to the circuit breakers 5 to open if the results of the DSP function indicate that a fault is present on the power line 3.

FIG. 3 illustrates an exemplary timing diagram for the protective relay system shown in FIGS. 1 and 2. Typically the signals from the power line 3 are sampled through the selection process provided by the multiplexor 17 at predefined intervals 71 during a signal sampling period 63. After a specified number of samples have been taken from the power line inputs 29, typically one sample from each multiplexor channel, or twenty samples, the samples are processed by the A/D converter 15 and then sent to the DSP 13. During a DSP algorithm period 65 the DSP processes the samples according to predefined procedures or algorithms based on the function of the particular protective relay system. The output of the DSP is provided to the first processor 11 at a predetermined time 69 and the first processor processes the information conveyed by the DSP output to detect a fault condition.

The sampling of inputs 29 from the power line and processing by the protective relay system all occurs within a specified time frame, the sample period 61, which is typically about 833.3 µsec (for 20 samples/cycle at 60 Hertz). During the sample period, the first processor is not optimally utilized, i.e., it does not perform essential operations during the entire sample period. Therefore, the timing diagram of the prior art protective relay shown in FIG. 3 indicates that during some portion of each sample period, the first processor is idle 74 or performing non-essential functions. The same procedures performed in the sample period 61 are repeated at continuous intervals.

Generally the protective relays as described above and known in the art have an operating life of approximately fifteen years. Maintenance testing is currently performed about once a year, depending on the user. Testing of the relays is performed manually, and requires that the relay be temporarily disconnected from the power system. Other than this annual maintenance check, no regular testing of the normal operation of protective relays is typically performed. Beyond this regular maintenance, only when an error in a relay is detected through improper performance within the electric power system, is the relay checked for integrity.

If one of the components within a relay malfunctions, this flaw is generally not detected unless a fault is not detected by the relay and allowed to propagate through the power system or if the relay causes the circuit breaker to open when no fault on the electric power system is actually present thereby unnecessarily interrupting power to end users. Only then is the relay specially tested for malfunctions and disconnected from the power system.

The lack of an automatic testing procedure for protective relays results in malfunctioning relays remaining in use in electric power systems. Such relays are unpredictable and may cause circuit breakers to operate when no fault is actually detected, or fail to activate the circuit breakers when a fault actually occurs.

In addition, the manual testing procedure currently employed is susceptible to workman error. Such errors may ultimately result in a system failure. Furthermore, the manual testing process requires that a fully operational relay be disconnected from the electric power system for scheduled testing to be performed.

Therefore, there is a need for a method and system that automatically and continuously test the operation of a microcomputer-based protective relay to detect any errors in the operation of the protective relay, to determine which component within the protective relay system is malfunctioning, and to automatically correct the malfunction, if possible.

SUMMARY OF THE INVENTION

These needs are fulfilled by the present invention which provides systems and methods for automatic testing of a microcomputer-based protective relay.

The method disclosed by the present invention provides for storing reference data corresponding to test signals generated by the microcomputer to perform the testing function necessary to detect errors in the relay. The reference data is stored in memory readily accessible by the microcomputer in the relay. A selected test signal is then continuously transmitted by the microcomputer as an input to the relay. The relay continues to sample data from the electric power system. Then, once every cycle, a selected test signal is sampled. Once the electric power system signals and the sampled selected test signal are processed by the relay according to predetermined relay operations, the microcomputer receives the altered test signal, defined as the test data, and compares it with the reference data corresponding to the test signal generated. If the signals correspond, then the relay is presumed to be operating properly and the process is repeated. If, however, an unexpected result is detected, the outputs of the relay are preferably disabled by the microcomputer and an error signal is produced.

After detection of a malfunction in the protective relay system, the method provides for automatic testing of each of the components within the protective relay system to determine which of the components is malfunctioning. Once the faulty component is identified, automatic correction or recalibration is attempted if the faulty component possesses that capability. If the faulty component is capable of automatic recalibration, this step is performed. Then, the entire protective relay system is preferably tested again to determine if the malfunction has been rectified by the automatic correction procedure. If proper operation of the protective relay system has been restored, the error is recorded as temporary, the relay is again connected to the electric power system and the circuit breakers and normal operation (with the automatic testing) is continued. If, however, the protective relay system is still malfunctioning, the relay preferably remains disconnected and an error signal is produced. In this case, the identity of the faulty component, if it has been determined, is also preferably stored for access by technicians attempting to manually repair the relay.

A system according to the present invention is also provided. In a preferred embodiment, the system includes a memory for storing the reference data, a processor coupled to the memory for generating the test signals, a plurality of selectors for choosing when the external input or the test signal input will be processed by the protective relay system and a second processor for performing the predefined procedure of the protective relay system on the input. The second processor preferably generates an output to the first processor for performing the comparison step of the method of the present invention.

BRIEF DESCRIPTION OF THE DRAWINGS

A full understanding of the invention can be gained from the following description of the preferred embodiment when read in conjunction with the accompanying drawings in which:

FIG. 8 is a detailed flowchart showing the steps carried out in connection with testing the entire protective relay system, shown as step 83 in FIG. 7;

FIG. 9 is a detailed flowchart showing the steps carried out in connection with isolating the protective relay system upon detection of an error, shown as step 87 in FIG. 7;

FIG. 10 is a detailed flowchart showing the steps carried out in connection with identifying the faulty component within the protective relay system, shown as step 89 in FIG. 7; and FIG. 11 is a detailed flowchart showing the steps carried out in connection with testing the selected component in the protective relay system, performed at step 182, 183 and 184 in FIG. 10.

DESCRIPTION OF THE INVENTION

A method and system which fulfills the above-mentioned needs and provides other beneficial features in accordance with the present invention is described below with reference to the figures. Those skilled in the art will readily appreciate that the description given herein with respect to the figures is for explanatory purposes only and is not intended in any way to limit the scope of the invention thereto. Also, common reference numbers are used throughout the figures to represent common elements.

Figure 4:
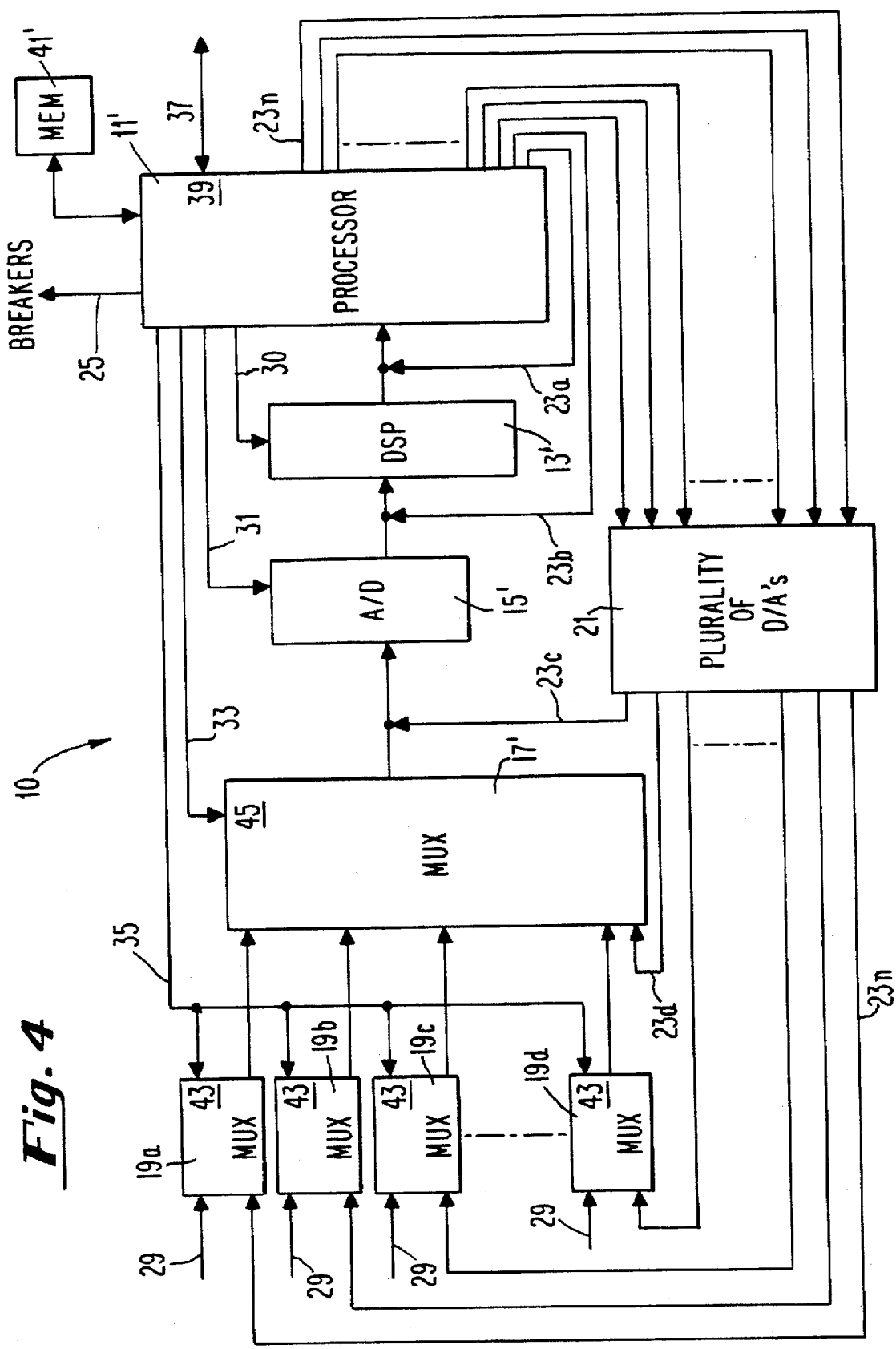
FIG. 4 is a block diagram of a protective relay system according to the present invention.

Referring now to the figures, FIG. 4 shows a protective relay system 10, according to the present invention. As shown in FIG. 4, protective relay system 10 receives inputs 29 from power lines 3, which have been reduced by current transformers 7 and voltage transformers 9 (not shown) to practical levels for use by the protective relay system, and transmits an output 25 to circuit breakers 5 (not shown) if a fault is detected. However, the protective relay system 10 is also configured so as to perform automatic and continuous self-testing of the entire protective relay system and testing of each component within the protective relay system. The protective relay system of the present invention also possesses the capability to automatically recalibrate certain components when they are determined to be malfunctioning.

The protective relay system 10 comprises a first processor 11', preferably a microprocessor such as a MC 68360. The first processor 11' contains a communication port 39, for transmitting information to and receiving information from a remote location through a communication line 37. The communication port is typically a front man-machine interface (MONI) port or a networking port and is used in connection with a modem or through a communication network of relays which are eventually tied to a sub-station computer and modem. However, it should be understood that other means of transmitting information are also contemplated. The first processor 11' is also connected to a local memory 41' for storing reference data and instructions.

A plurality of selectors, such as multiplexors (MUXes) 19, receive the transformed inputs 29 from the power line 3 and test signals from the first processor 11'. The first processor controls the plurality of MUXes 19 through channel selector ports 43 by a control line 35 in order to select either the power line inputs 29 or the test signal inputs 23 as the input to the protective relay system.

The multiplexor 17' selects (i.e., samples) the output from one of the plurality of MUXes for processing by the protective relay system. Another output line 23d from the first processor 11' also serves as an input through one of a plurality of digital-to-analog converters 21(D/As) to the multiplexor for individual component testing which is described in detail below. Additionally, the first processor preferably controls the channel selected by the multiplexor 17' by transmitting a signal on a control line 33 to the multiplexor channel selector port 45.

The output of the multiplexor 17' serves as an input to the next component within the protective relay system 10, which in a preferred embodiment is the analog-to-digital (A/D) converter 15'. The first processor also preferably has the capability to provide input to the A/D converter through one of the output lines 23c. This connection from the first processor through one of a plurality of digital-to-analog converters 21 (D/As), to the A/D converter allows for individual component testing of the A/D converter as is described below. In addition, the A/D converter preferably has an automatic recalibration feature which may be controlled by the first processor through another control line 31. The recalibration function in the A/D converter is known in the art and will be discussed in more detail below in connection with FIG. 7. Recalibration of the A/D converter may automatically correct a detected malfunction of the A/D converter by adjusting the digital output to more closely represent the analog input received.

The plurality of MUXes 19, multiplexor 17' and the A/D converter 15' preferably have at least one direct input line 23 from the first processor 11'. In order for the signals from the first processor to be properly processed by these components, the signals from the first processor are preferably converted from the digital representation generated by the first processor to an analog signal. Therefore, a plurality of digital to analog (D/A) converters 21 convert the signals from the first processor to analog signals before they are transmitted as inputs to the above-mentioned components, the plurality of MUXes 19, the multiplexor 17' and the A/D converter 15'.

Preferably, the output from the A/D converter provides the input to a second processor 13' within the protective relay system 10, such as a digital signal processor (DSP). The DSP 13', performs certain functions on the input signal received from the A/D converter 15', for collecting information relating to the power line 3, including detecting any faults or disturbances on the power line.

In the protective relay system of the present invention, the first processor 11' also preferably provides a direct interface to the DSP 13 through an output line 23b in order to perform component testing on the DSP after a malfunction of the protective relay system is detected pursuant to the method of the present invention. Individual component testing is described in detail below. Furthermore, the DSP may be reinitialized, or recalibrated, by the first processor by transmitting data from the first processor to the DSP through another control line 30. Recalibration of the DSP, by transmitting new code and new initial settings, may correct a malfunction detected in the operation of the DSP.

Figure 5:
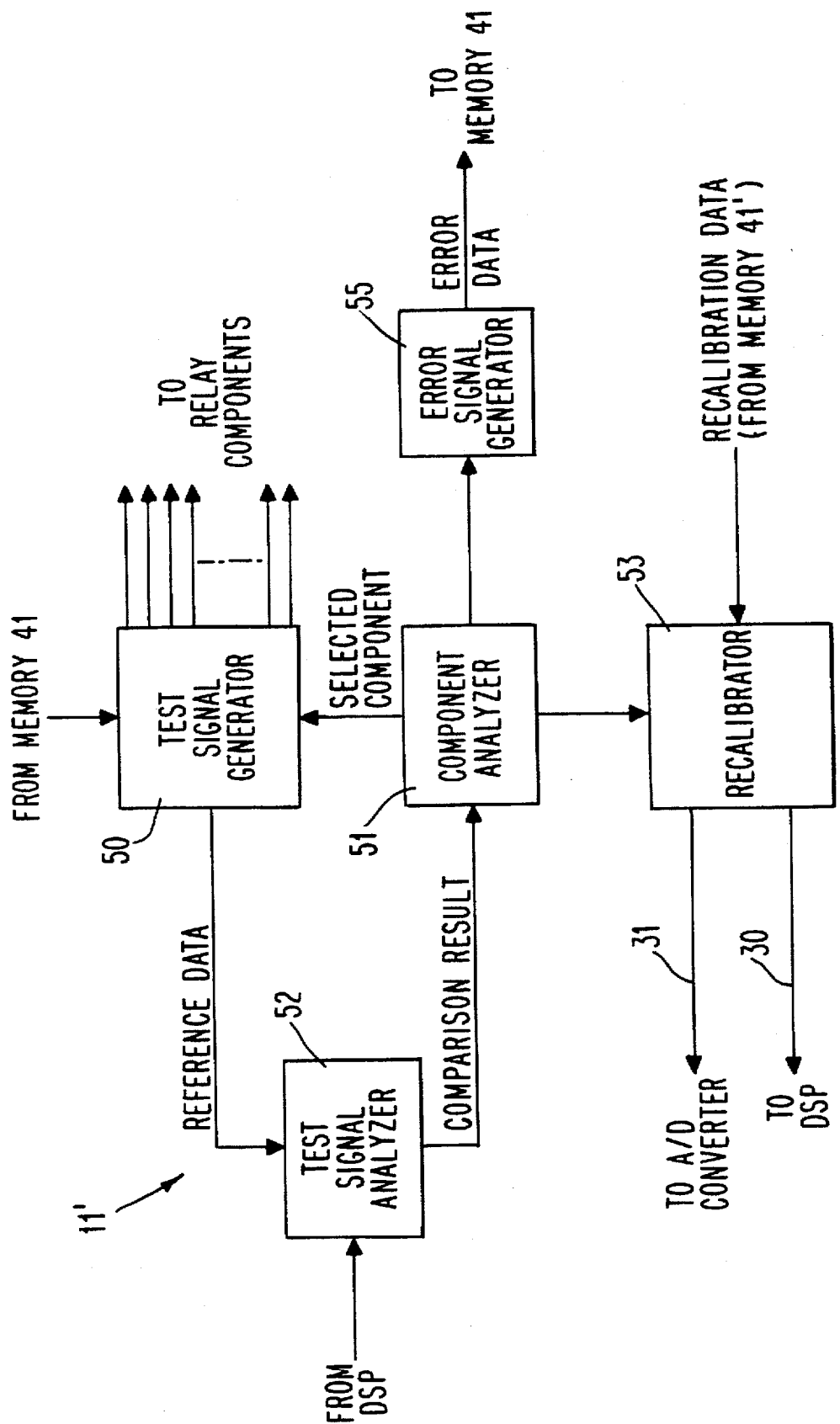
FIG. 5 is a functional block diagram showing the testing components of the first processor in accordance with a preferred embodiment of the present invention.

FIG. 5 is a functional block diagram showing the testing components of the first processor 11'. As shown in FIG. 5, a test signal generator 50 generates, based on reference data retrieved from memory 41', a test signal which is then transmitted as inputs to the protective relay system, or some component of the relay, on the output lines 23. The selection of particular reference data and the generation of particular test signals is described in more detail below. The reference data may be provided to the test signal analyzer 52 from the test signal generator 50 as shown, or alternatively can be provided directly from memory 41' as should be understood. The test signal analyzer receives the DSP output which represents test signal data when a test signal is selected by the plurality of MUXes. The test signal analyzer compares the reference data with the test signal data as is described more fully below to determine whether or not a possible malfunction within the protective relay exists. If a possible malfunction is detected, the component analyzer 51 is enabled by the test signal analyzer based on the result of the comparison and an error signal is generated by the error signal generator 55. Error data is then sent to memory 41' for reference by technicians. The component analyzer is also described in detail below, but generally functions to identify the malfunctioning component of the protective relay through a process of selecting a component to which the test signal generator outputs a test signal and analyzing the result of the comparison made by the test signal analyzer upon receipt of the test signal data received from the DSP. The error data and identity of the faulty component, if detected, are also stored in memory 41'. In a preferred embodiment, the first processor also includes a recalibrator 53, which provides recalibration signals and/or data to a faulty component, such as the A/D converter or DSP as shown, to correct a detected malfunction. The details of the recalibration process are also described in detail below.

Figure 1:
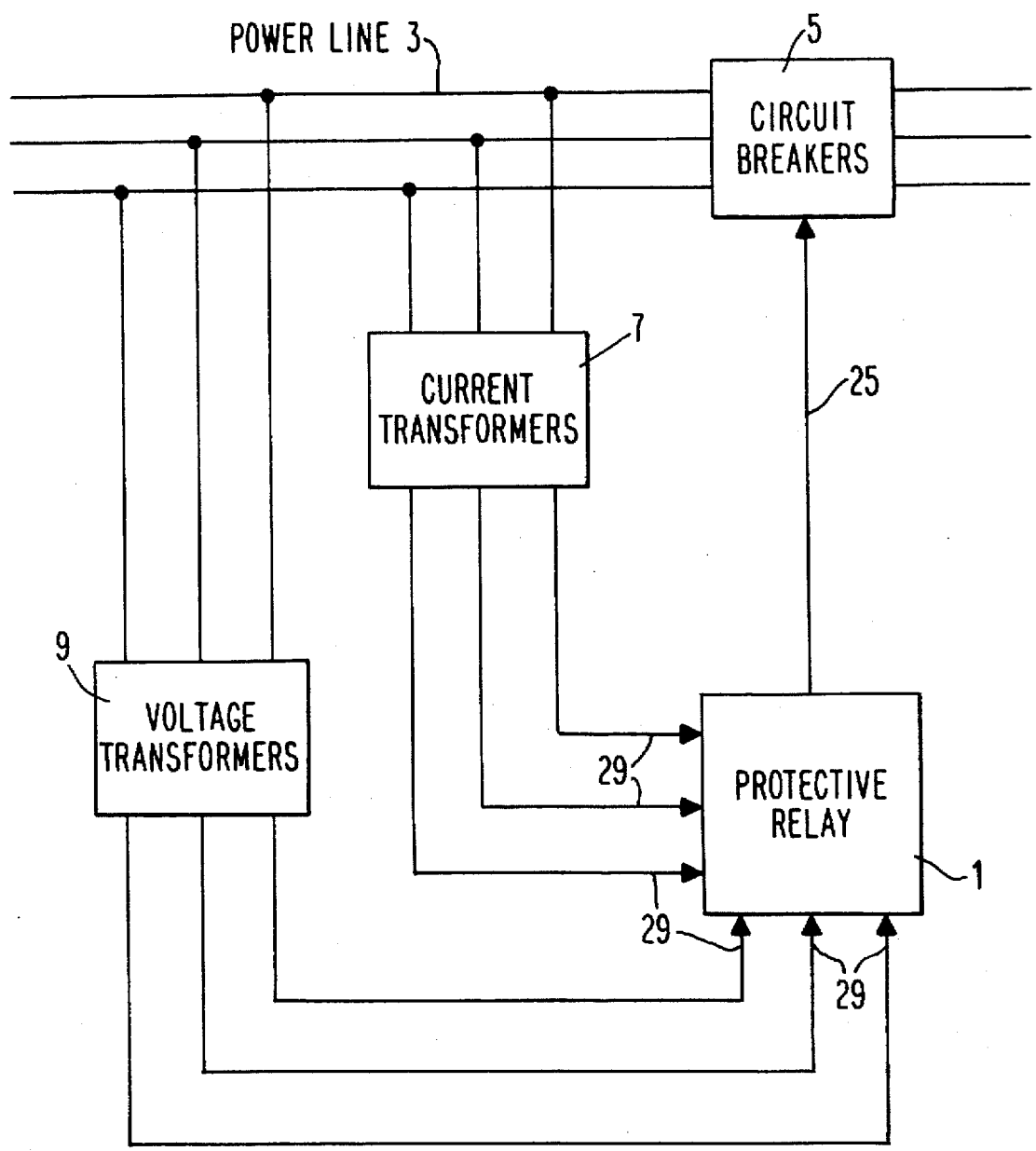
FIG. 1 is a block diagram showing the connections between the protective relay system, circuit breakers and an electric power system according to the prior art.
Figure 2:
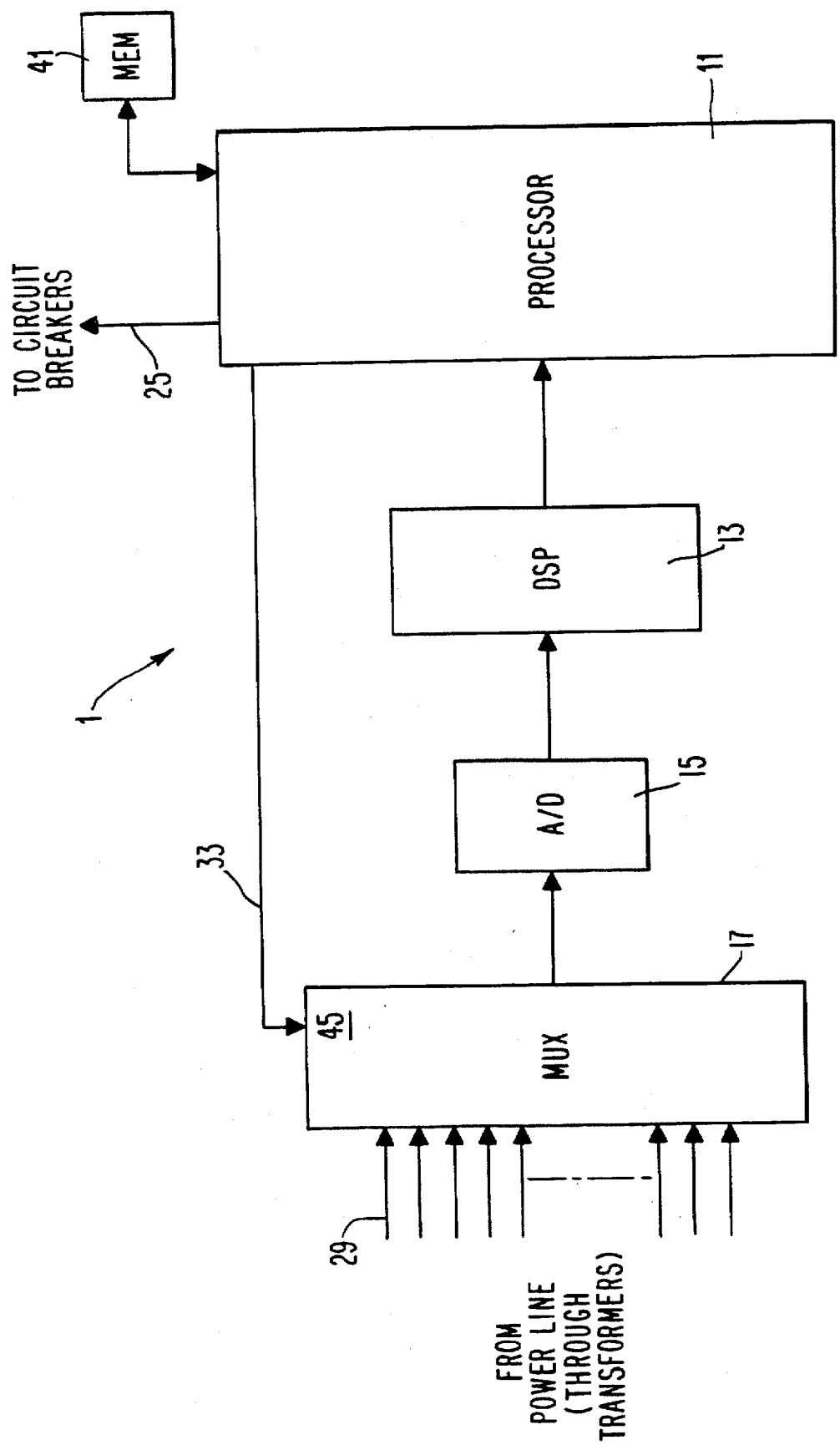
FIG. 2 is a block diagram of a protective relay system in accordance with the prior art.
Figure 3:
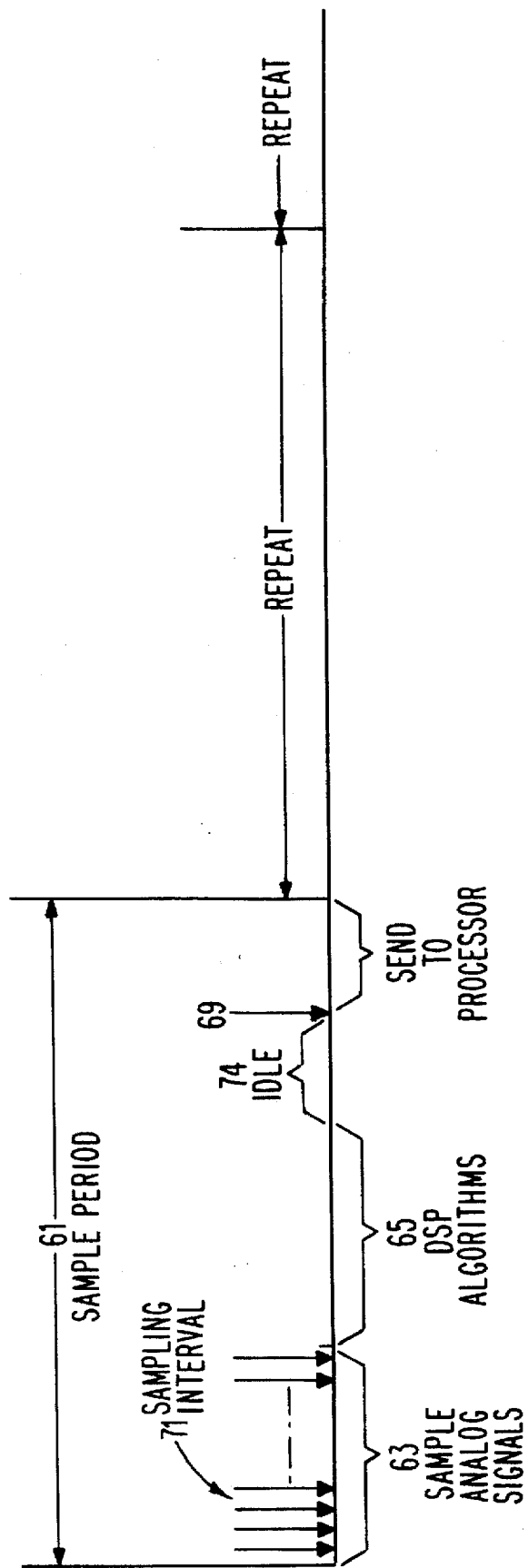
FIG. 3 is a timing diagram showing the sampling period of a prior art protective relay system.
Figure 6:
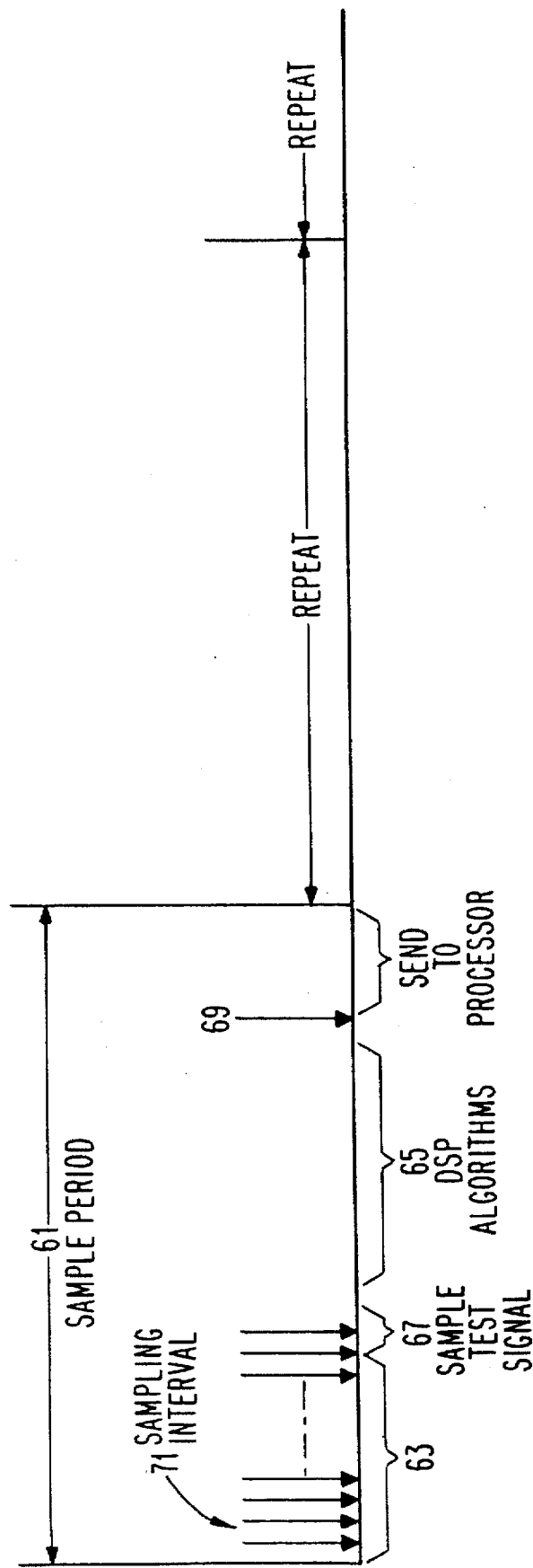
FIG. 6 is a timing diagram showing the sampling and testing procedures of the protective relay system in accordance with a preferred embodiment of the present invention.

To better describe the operation of the present invention as distinguished from the prior art, the timing diagrams displaying the sample period 61 of the protective relay system 10 of the present invention compared with that of the prior art protective relay system 1 is useful. FIG. 3, described above, shows the sampling performed in a typical protective relay system 1 according to an exemplary prior art relay. FIG. 6, in contrast, shows the timing diagram of a protective relay system 10 performing the automatic testing method of the present invention. As shown in the timing diagram of FIG. 6, the automatic testing procedure is carried out in the protective relay system 10 of the present invention without affecting the normal operation of detecting faults in the power system and without compromising the integrity of the protective relay system's performance. The testing procedure may be performed during the pre-existing idle time 74 of the first processor and during the normal DSP algorithm processing period 65 shown in FIG. 3 and described above in connection with known protective relay systems so that the performance of the protective relay system 10 according to the present invention is not adversely affected.

In the present invention as shown in FIG. 6, the preferred sample period 61 remains the same as the sample period 61 shown in FIG. 3, e.g., 833.3 μsec. During the sample period 61 of the protective relay system, one of the test signals generated by and output from the first processor is selected as the input to the protective relay system through the channel selection of the plurality of MUXes and the channel selection of the multiplexor. Preferably, selection occurs during the test signal sampling period 67. The selected test signal is then transmitted to the DSP along with the sampled input signals from the power line, which are still collected during the normal signal sampling period 63. The DSP processes all of the input signals from the power system and additionally the selected test signal in accordance with the predefined procedures during the DSP algorithm period 65. At a predetermined time 69, the processed signals are output from the DSP to the first processor. Then, while the first processor is evaluating the data generated by processing the input signals from the power system, it also analyzes the test signal data generated from processing the selected test signal within the sample period 61 time so it is finished and ready to receive additional input from the DSP at the next predetermined time 69. In the preferred embodiment, the test signals are continuously generated by the first processor and are constantly present on the output lines 23 from the first processor.

Figure 7:
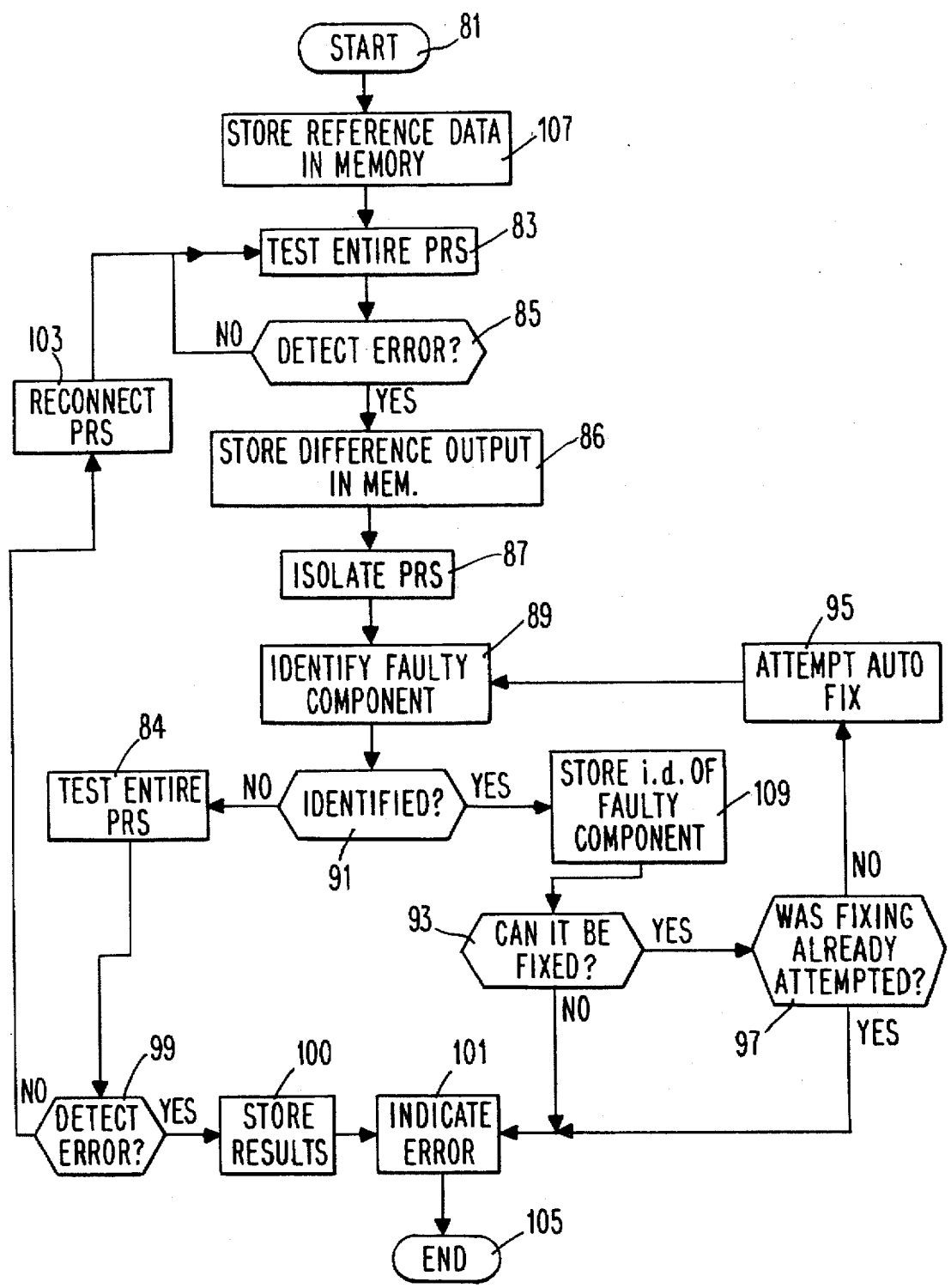
FIG. 7 is a flowchart showing the steps carried out in accordance with the present invention.

FIGS. 7-11 are flowcharts showing, in detail, the steps carried out in performing the methods of the present invention. FIG. 7 is a flowchart which generally depicts the steps taken and selections made in performing the method in accordance with the present invention.

Referring now to FIG. 7, when the method of the present invention starts at 81, reference data representing the expected results upon the proper operation of the protective relay system 10, or a designated portion thereof, based on specified test signals is preferably stored at step 107 in the memory connected to the first processor. The reference data may be stored manually via the first processor or transmitted from a remote location through the communication port. Next, the entire protective relay system is tested for proper operation at step 83, as is explained in more detail below. The method next determines whether an error, indicative of a possible malfunction in the protective relay system, has been detected at step 85 by the testing procedure during step 83. If an error was not detected, the testing procedure is repeated at continuous intervals as shown by the timing diagram of FIG. 6.

If, however, an error is detected upon testing the entire protective relay system, the result of the testing procedure is stored in local memory at step 86. Then, the protective relay system is preferably isolated at step 87 from the circuit breakers 5 and the power lines 3, described more fully in connection with FIG. 9 and the accompanying text. Once the protective relay system has been isolated, a component analysis procedure for identifying the faulty component within the protective relay system is preferably performed at step 89. This process includes individual testing of the various components within the protective relay system, and is described more fully in connection with FIG. 10 and the accompanying descriptive text.

After component analysis at step 89, the method preferably determines if the faulty component was, in fact, identified at step 91. If a faulty component was identified, the identity of the faulty component is preferably stored in memory at step 109 for reference by technicians if manual repair becomes necessary, and in any event, for future reference. Next, the method of the present invention determines if that component is one that can be recalibrated at step 93. If not, an error signal is preferably generated at step 101 and the method ends as shown at 105 with the protective relay system preferably remaining disabled to await manual repair.

If the faulty component was identified and is capable of recalibration, the method determines if previous attempts to correct that same component have been made at step 97. If so, an error signal is preferably generated terminating the method at 105 such that the protective relay system preferably remains disabled to await manual repair. If, however, an attempt to recalibrate that component has not already been made and the malfunctioning component is one that may be recalibrated, automatic recalibration is preferably attempted at step 95. The automatic recalibration of step 95 can currently be performed in two of the components of the protective relay system of the present invention, the A/D converter and the second processor, or DSP.

The A/D converter has the capability of automatic internal recalibration preexisting in the typical prior art component. Automatic recalibration is performed by the A/D converter upon receiving a simple toggle signal on one of its input lines 31, as described above. Therefore, when the first processor detects an error in the A/D converter, the first processor merely transmits a toggle signal (high) to instruct the A/D converter to recalibrate. This results in an internal recalibration attempt by the A/D converter.

Recalibration of the second processor, or DSP, is performed in a somewhat different manner. If the error in the protective relay system is found to be caused by the DSP, the first processor can download new code and initial settings to the DSP through another input line 30. This essentially re-programs the DSP in order to eliminate any problems caused by improper coding, programming errors or improper primary settings.

If recalibration was attempted at step 95, each component is preferably individually tested again at step 89 to determine if proper operation has been restored. If the error does not reoccur, the recalibration is presumed to have rectified the problem in the protective relay system. In that case, the error is recorded as "temporary" and the protective relay system is reconnected to the power line and the circuit breakers, and normal operation of the protective relay system (with the automatic testing procedure) is recommenced.

If, after the protective relay system was initially isolated, upon testing to identify the faulty component at step 89, no faulty component is identified as determined at step 91, the testing of the whole protective relay system is performed again at step 84. If an error then is detected 99, the results from the testing procedure are stored in memory at step 100. Then, an error signal is preferably generated at step 101 and the method ends at 105 with the protective relay system preferably remaining isolated to await manual repair. If, on the other hand, no error is detected when the whole protective relay system is again tested at step 84, the faulty component has been recalibrated or the malfunction originally detected was not actually present or has been eliminated through some other means. If this occurs, the error is recorded as "temporary" and the protective relay system is reconnected at step 103 to the power lines and the circuit breakers to permit normal operation of the protective relay system, including the continuous testing of the entire protective relay system at step 83. "Temporary" errors may indicate future trouble, but do not result in immediate disabling of the protective relay system.

FIG. 8 illustrates the procedure for testing the entire protective relay system of step 83 in more detail. First, the test signal to be transmitted from the first processor to the plurality of MUXes is selected at step 123. The selection of the test signal may be performed at a remote location and the choice transmitted to the first processor through the communication port 39 or input directly to the first processor. This selection is generally made so that the test signal selected at step 123 is representative of typical external inputs received from the power lines. Therefore, in the preferred embodiment, the test signal selected is a digital representation of a known sine wave.

Once the test signal has been selected, a digital representation of that test signal is generated at step 125 by the test signal generator of the first processor. The first processor preferably continuously transmits the digital test signal at step 127 to the plurality of MUXes 19 as inputs to the protective relay system so that the signals are continuously present on the output lines 23 connecting the first processor to the plurality of MUXes as shown in FIG. 4.

At a continuous interval, as described above in connection with FIG. 6, the test signals are sampled at step 129 by the plurality of MUXes and are processed as inputs at step 131 by the protective relay system. The sampling step 129 and processing step 131 of the test signal is performed by the normal predefined operation of the protective relay system, except that the first processor preferably transmits a signal on the control line 35 to the channel selector 43 of the plurality of MUXes 19 and the channel selector 45 of the main multiplexor 17 to select the test signal inputs 23 as shown in FIG. 4 once during each sample period 61 as shown in FIG. 6. Therefore, the test signals are treated the same as the external inputs from the power lines which are normally evaluated by the protective relay system.

Once every sample period, at a predetermined time, the test data, along with the normal input signals, after being processed by the protective relay system as shown at step 131, are read by the first processor at step 133. The first processor then compares the test signal data which has been processed according to the predefined procedures of the protective relay system with the corresponding reference data stored in the memory as shown at step 135. The test signal analyzer of the first processor preferably performs the comparison at step 135 and determines if the test signal data and the reference data correspond. It should be understood that various methods of comparison could be utilized to detect unexpected results in the test signal data, and thus faulty operation of the protective relay system or of a particular component within the protective relay system. If the test signal data and reference data correspond, the protective relay system 10 is determined to be operating properly. If a difference is detected during the comparison step 135, then an error in the protective relay system has most likely occurred.

FIG. 9 is a detailed flowchart for the steps performed in isolating the protective relay system upon detection of an error corresponding to step 87 in FIG. 7. As explained above, if an error is detected during the comparison step, the output of the protective relay system to the circuit breakers is preferably disabled at step 153. If the protective relay system is malfunctioning, disabling the output at step 153 ensures that the circuit breakers connected to the faulty protective relay system will not be operated erroneously. This prevents the circuit breakers from opening and interrupting the power lines without cause.

To accurately test the components in the protective relay system to determine the cause of a possible malfunction, known test signals preferably comprise the only inputs to the protective relay system. The input signals from the power lines are unknown signals and would not, therefore, be conducive to the testing procedure of the present invention. To avoid processing the external input signals which cannot be used in the component testing procedure, the plurality of MUXes, which initially select the inputs to the protective relay system alternately from the power line and from the test signal inputs, are accordingly set to only accept input of selected test signals. Therefore, the first processor transmits a signal on the channel selector line 35 to the channel selector ports 43 continuously selecting test signal inputs. In this way, the external inputs to the protective relay system are also disabled at step 155.

FIG. 10 shows a detailed flowchart of the steps carried out by the component analyzer 51 in identifying a potentially faulty component at step 89 shown in FIG. 7. Again, after a problem in the protective relay system has been detected, and the protective relay system has been isolated, the method of the present invention provides for individual component testing to determine which component within the protective relay system is malfunctioning.

The procedure for identifying the faulty component of the protective relay system is substantially similar to the method for continuously testing the entire protective relay system described above in connection with step 83. Referring to FIG. 10, the first component to be tested is preferably selected at step 167. The selected component and all subsequent components that normally operate on the input signals 29 of the protective relay system are tested according to the component testing procedure at step 183. The component testing procedure 183 indicates whether an error has occurred while processing the selected test signal by the selected component and subsequent components in the protective relay system. In other words if the multiplexor 17' as shown in FIG. 4 is selected, the subsequent components are the Analog-to-digital converter 15, the DSP 13 and the first processor 11. If an error is detected, then presumably at least one of these components is malfunctioning.

Once the selected component and subsequent components have been tested, the testing process branches depending on whether an error was detected as determined at step 177. If an error was detected, indicating a malfunction in the selected component or some subsequent component, and if the selected component as determined at step 179 is the last component in the succession of components, then the selected component is identified as the faulty component at step 199 and the process of identifying the faulty component ends at 203 successfully. If, however, the selected component was not the last component as determined at step 179, and an error was detected at step 177, this indicates that either the selected component or some subsequent component is malfunctioning. In order to particularly identify the faulty components, the component immediately succeeding the selected component is chosen as the selected component at step 181. In other words, after detecting an error, if the selected component is the MUX 17' in FIG. 4, then the next component tested is the A/D converter 15' which becomes the selected component.

Once the next component is selected, the component testing process is repeated at step 182. Again, the component testing process at step 182 indicates if an error has been detected in the selected component or any subsequent component within the protective relay system. If an error is not detected as determined at step 176, then the component immediately preceding the currently selected component, i.e., the component which was the selected component during the preceding testing cycle where an error was still detected, is identified as the faulty component at step 187. Using the example above, the MUX 17 would be identified as faulty if after selecting the Analog-to-digital converter, no error is detected. The process may then end at 203 successfully.

If, however, an error is still detected at step 176, the method again determines if the selected component is the last component within the protective relay system at step 179. The same succeeding steps are then preferably repeated, i.e., either the last component is faulty at step 199 or the next component is selected as the component to test at step 181, and the testing is repeated until the faulty component is found.

If no error was detected at step 177 after testing the first component to be chosen as the selected component at step 183, this indicates that the faulty component is one of the components operating within the protective relay system before the first component selected for testing or that the error within the protective relay system cannot be found. To determine if the error is detectable, a check is made at step 189 to determine if the selected component is the first component in the succession. If so, then the faulty component was not found 201 during the component testing and the method ends at 203 without successfully identifying the malfunctioning component. In the presently preferred embodiment, the plurality of MUXes 19 and the main multiplexor 17' are treated as one component. Thus, the multiplexor 17' is identified as the "first component" during the component testing procedure. It should be understood by those skilled in the art, however, that each of the plurality of MUXes 19 could be tested in a similar fashion to isolate the faulty one.

If the selected component is not the first component as determined at step 189 and no error was detected at step 177, then a component preceding the selected component within the protective relay system could be the faulty component, and further testing is necessary to particularly identify the faulty component. In this situation, the immediately preceding component is preferably chosen as the selected component at step 191. For example, if the DSP 13' was the selected component and no error was detected, the A/D converter 15' would be chosen as the selected component for testing. The selected component testing procedure at step 184 is preferably repeated with the new selected component. If an error is then detected at step 178, the currently selected component is identified as faulty at step 197 and the method again ends 203 with successful identification of the malfunctioning component.

If, however, an error is still not detected at step 178, the method of selecting the next preceding component at step 191 and testing it at step 184 is preferably repeated until the faulty component is identified at step 197 or until the first component in the protective relay system is tested and no error is detected, indicating that the faulty component could not be determined at step 201.

FIG. 11 is a detailed flowchart of the steps carried out in connection with the testing of the selected component and subsequent components in the protective relay system to determine if an error is detected as shown generally at steps 182, 183, and 184 in FIG. 10. After a selected component is chosen for testing, the following steps are preferably carried out. A specific test signal is selected at step 213 based on the component selected to be tested. Again, the selection at step 213 may occur directly at the first processor or may be made at some remote location and the instruction transmitted to the first processor through the communication port.

The selection of the test signal is more complex in the component testing than during the continuous testing process because different test signals provide a more thorough test for different components. For example, when testing the operation of the DSP, the presently preferred test signal for the most extensive testing is a plurality of square waves at least one of which is representative of the value HEX AA and at least one of which is representative of the value HEX 55. Likewise, the preferred test signal for use in testing the A/D converter is a plurality of sine waves at least one of which has a magnitude representative of the maximum input value applied to the protective relay system and at least one of which has a magnitude representative of the minimum input value applied to the protective relay system. Similarly, to thoroughly test the multiplexor, a plurality of sine waves of various known magnitudes and angles are used in the preferred embodiment.

In addition, the reference data stored in memory corresponding to the test signals selected for the specific components within the protective relay system preferably represents the expected results upon processing the selected test signal by the selected component and each subsequent component. Since this test data may be predetermined based on a corresponding test signal being transmitted directly to a selected component within the protective relay system, the data is preferably generated and stored in memory in advance.

Then, after the test signal to be used is selected at step 213, it is continuously transmitted at step 215 from the first processor to the selected component. That test signal is processed or modified by the selected component at step 217 according to its predefined operation. Then the selected test signal is further processed by each subsequent component at step 219 in accordance with their respective predetermined operating procedures.

Again, once every sample period, at a predetermined time, the first processor reads its input channel at step 221 which now consists only of test data, since the input from the power line 3 has been disabled. The first processor performs the comparison operation at step 223 between the test signal data and the corresponding reference data stored in memory. Again, a difference detected during the comparison operation at step 223, indicates an error in some component in the protective relay system which operated on the selected test signal transmitted from the first processor directly to the selected component. In other words, a difference detected in the comparison step 223 indicates that the selected component or a subsequent component is malfunctioning. Accordingly, the faulty component may then be identified by repeating the appropriate steps shown in FIG. 10.

While the invention has been described and illustrated with reference to specific embodiments, those skilled in the art will recognize that modification and variations may be made without departing from the principles of the invention as described hereinabove and set forth in the following claims.

We claim:

1. A method for continuous and automatic testing of a protective relay system comprising the steps of:

storing a plurality of sets of reference data, each set corresponding to one of a plurality of test signals;

generating one of the plurality of test signals based on a corresponding set of reference data on a continuous basis and defining the same as a selected test signal;

sampling at a selected interval the selected test signal and defining the same as a sampled selected test signal;

processing the sampled selected test signal in accordance with a predefined procedure to generate an output of test data;

comparing the selected test data with the set of reference data corresponding to the selected test signal and, if based on the comparison, there is a difference, then generating a difference output indicative of improper operation of the protective relay system.

2. The method of claim 1, wherein the protective relay system has at least one external output, the method further comprising the steps of:

detecting the difference output; and disconnecting all external outputs of the protective relay system upon detection of the difference output.

3. The method of claim 1, further comprising the steps of:

detecting the difference output; and generating an error signal upon detection of the difference output.

4. The method of claim 1, wherein the selected test signal is indicative of a known sine wave.

5. The method of claim 1, further comprising the step of: receiving the plurality of sets of reference data from a remote location.

6. The method of claim 1, wherein the protective relay system has a local memory, further comprising the steps of:

detecting the difference output; and storing the difference output in the local memory.

7. The method of claim 6, further comprising the step of visibly displaying the difference output.

8. The method of claim 1, wherein the protective relay system has a communication means, the method further comprising the steps of:

detecting the difference output; and transmitting the difference output to a remote location by the communication means.

9. The method of claim 1, wherein the protective relay system has a communication means and wherein the selected test signal is chosen and transmitted to the protective relay system from a remote location by the communication means.

10. The method of claim 1, comprising the further steps of:

detecting the difference output; and activating an audible alarm in response to detecting the difference output.

11. The method of claim 1, wherein the protective relay system comprises a plurality of components, the method further comprising the step of automatically determining whether any one of the components is malfunctioning and, if so, defining the same as a faulty component.

12. The method of claim 11, further comprising the step of storing the identity of the faulty component in a memory.

13. The method of claim 12, comprising the further step of displaying a visible error message identifying the faulty component.

14. The method of claim 12, further comprising the step of transmitting the identity of the faulty component from the protective relay system to a remote location.

15. The method of claim 11, wherein the faulty component has an automatic recalibration function, the method further comprising the step of transmitting a recalibration signal to the faulty component.

16. The method of claim 15, further comprising the further steps of:

recalibrating the faulty component in response to the recalibration signal; and verifying that the faulty component so recalibrated is no longer malfunctioning.

17. The method of claim 1, wherein the plurality of sets of reference data are transmitted to the protective relay system from a remote location.

18. The method claim 1, wherein the automatic and continuous testing does not interfere with the normal operation of the protective relay.

19. In a protective relay system comprising a signal interface for receiving power system inputs, a signal processor for processing the power system inputs in accordance with a predefined procedure and a data processor for analyzing the power system inputs as modified, a system for testing conditions of the protective relay system comprising:

a test signal generator for generating a plurality of test signals and for outputting the same to the signal processor;

a selector interfaced to the test signal generator and the signal interface and for selecting at least one of the plurality of test signal to provide an input to the signal processor on a continuous interval, and defining the same as a sampled selected test signal;

the signal processor interfaced to accept the sampled selected test signal and for processing the same in accordance with a predefined procedure to generate an output of selected test data; and a test signal analyzer interfaced to accept the selected test data for comparing the selected test data with a set of reference data corresponding to the selected test signal resulting in a difference, if any, indicative of improper operation of the protective relay system.

20. A method for identifying a malfunctioning component in a protective relay system, wherein the protective relay system comprises a plurality of components serially interfaced in succession from a first component to a last component and wherein a plurality of sets of reference data are stored in a memory accessible by the protective relay system, each set of reference data corresponding to one of a plurality of test signals, the method comprising the steps of:

selecting one of the plurality of components to test and defining the same as a selected component;

generating one of the plurality of test signals and defining the same as a component test signal;

providing the component test signal as an input to the selected component;

processing the component test signal through the selected component and the components subsequent to the selected component in the succession of components in accordance with a predefined procedure to generate an output of selected component test data; and comparing the selected component test data with the set of reference data corresponding to the component test signal and if, based on the comparison, there is a difference, generating a difference output indicative of one of (1) improper operation of the selected component and (2) improper operation of one of the components subsequent to the selected component in the succession of components.

21. The method of claim 20, wherein if, based on the comparison, there is no difference, and wherein the selected component is the first component, the method further comprising the step of generating a no fault signal indicative of failure to detect a malfunctioning component in the protective relay system.

22. The method of claim 20, wherein if, based on the comparison, there is a difference, the method further comprising the step of testing the component immediately succeeding the selected component in the succession of components, and defining the same as the selected component.

23. The method of claim 22, the method further comprising the step of defining the component immediately preceding the selected component as a faulty component if no difference output is generated upon testing the selected component.

24. The method of claim 20, wherein if, based on the comparison, there is a difference, and if, the selected component is the last component, the method further comprising the step of defining the selected component as a faulty component.

25. The method of claim 20, further comprising the step of transmitting the difference output from the protective relay system to a remote location.

26. The method of claim 20, wherein if the selected component is a digital signal processor, the selected test signal is a plurality of square waves at least one of which is representative of the value HEX AA and at least one of which is representative of the value HEX 55.

27. The method of claim 20, wherein if the selected component is an analog-to-digital converter, the selected test signal is a plurality of sine waves at least one of which has a magnitude representative of a maximum input value applied to the protective relay system and at least one of which has a magnitude representative of a minimum input value applied to the protective relay system.

28. The method of claim 20, wherein if the selected component is a multiplexor, the selected test signal is a plurality of sine waves of various known magnitudes and angles.

29. The method of claim 20, wherein if, based on the comparison, there is no difference, the method further comprising the step of testing the component immediately preceding the selected component in the succession of components, and defining the same as the selected component.

30. The method of claim 29, further comprising the step of defining the selected component as a faulty component if the difference output is generated upon testing the selected component.

31. A system for automatic and continuous testing of a protective relay system comprising:

a memory means for storing a plurality of sets of reference data each set corresponding to one of a plurality of test signals;

a first processing means coupled to the memory means for generating the plurality of test signals based on corresponding sets of reference data on a continuous basis;

a selection means coupled to the test signal generation means for selecting one of the plurality of test signals and defining the same as a selected test signal;

a second processing means interfaced to accept the selected test signal and for processing the selected test signal in accordance with a predefined procedure to generate an output of selected test data; and said first processing means being interfaced to accept the selected test data and for comparing the selected test data with the set of reference data corresponding to the selected test signal to identify a difference, if any, indicative of improper operation of the protective relay system.

32. The system of claim 31, further comprising a communication means coupled to the first processing means for communicating with a remote computer.

33. The system of claim 31, wherein the selection means comprises:

a plurality of selectors each being coupled to the first processing means for receiving at least one of the plurality of test signals and to an external source for receiving at least one of a plurality of external input signals for selecting one of (1) the test signals and (2) the external input signals;

a multiplexing means interfaced with the plurality of selectors for selecting an output from one of the plurality of selectors, wherein the selected test signal is provided by the selection of one of the test signals by the selector selected by the multiplexor.

34. The system of claim 33, wherein the plurality of test signals and the plurality of external input signals are analog signals, the system further comprising:

an analog-to-digital converter means interfaced between the multiplexing means and the second processing means to accept the output from the multiplexing means and for converting the same to a digital representation thereof for further processing by the second processing means.

35. The system of claim 33, wherein the first processing means is coupled to each of the plurality of selectors and to the multiplexing means for transmitting a channel selection signal.

36. The system of claim 34, wherein the first and second processing means, the multiplexing means and the analog-to-digital converter means are each interfaced to accept the plurality of test signals from the first processing means.

37. The system of claim 34, wherein the first processing means is coupled to the first converter means and the second processing means for transmitting a recalibration signal or recalibration data.

38. The system of claim 31, wherein the automatic and continuous testing does not interfere with the normal operation of the protective relay.

39. A system for automatic testing of a protective relay system having a plurality of serially connected components in succession from a first component to a last component, comprising:

a test signal generator for generating, on a substantially continuous basis, a test signal based on a predefined set of reference data and outputting the test signal to the first component wherein the test signal is processed by each of the serially connected components in succession resulting in an output from the last component representative of test signal data; and a test signal analyzer interfaced to receive the output from the last component and comparing, on a substantially continuous basis, the test signal data with the set of reference data and, based on the comparison, detecting a possible malfunction within the protective relay system.

40. The system of claim 39, further comprising:

a component analyzer interfaced with test signal analyzer for automatically testing individual components to identify which of the components is malfunctioning in response to the detection of possible malfunction within the protective relay system.

41. The system of claim 39, wherein the operation of the test signal generator and test signal analyzer and component analyzer do not affect fault detection by the protective relay system.

42. The system of claim 39, wherein the protective relay system is interfaced with a power transmission system, and wherein the protective relay system is automatically isolated from the power transmission system in response to detecting the possible malfunction.

43. The system of claim 40, further comprising:

recalibration means for recalibrating the component identified as malfunctioning.

44. The system of claim 43, wherein the protective relay system is interfaced with a power transmission system, and wherein the protective relay system is automatically isolated from the power transmission system in response to detecting the possible malfunction and wherein the interface between the protective relay system and the power transmission system is automatically restored if the component identified as malfunctioning is correctly recalibrated.

\* \* \* \* \*